(12) United States Patent
Schneider et al.

(10) Patent No.: US 7,017,048 B2
(45) Date of Patent: Mar. 21, 2006

(54) CIRCUIT CONFIGURATION FOR GENERATING CURRENT PULSES IN THE SUPPLY CURRENT OF INTEGRATED CIRCUITS

(75) Inventors: Otto Schneider, Geisenfeld (DE); Dirk Uffmann, München (DE)

(73) Assignee: Infineon Technologies AG, Munich (DE)

(*) Notice: Subject to any disclaimer, the term of this patent is extended or adjusted under 35 U.S.C. 154(b) by 993 days.

(21) Appl. No.: 10/021,689

(22) Filed: Nov. 13, 2001

(65) Prior Publication Data

US 2002/0067198 A1 Jun. 6, 2002

Related U.S. Application Data

(63) Continuation of application No. PCT/EP00/03879, filed on Apr. 28, 2000.

(30) Foreign Application Priority Data

May 12, 1999 (EP) .................................. 99109552

(51) Int. Cl.
*H04L 9/32* (2006.01)
(52) U.S. Cl. .............................. 713/194; 326/8; 326/31
(58) Field of Classification Search ................ 713/172, 713/192, 174, 185, 191, 193–194, 1; 708/250–252, 708/254–256; 235/462.28, 487, 492; 326/8, 326/21–22, 26, 28–29, 31, 62–63, 81, 108, 326/121
See application file for complete search history.

(56) References Cited

U.S. PATENT DOCUMENTS

| | | |
|---|---|---|
| 4,797,579 A | 1/1989 | Lewis |
| 4,829,199 A | 5/1989 | Prater |
| 5,041,741 A | 8/1991 | Steele |
| 5,598,348 A | 1/1997 | Rusu et al. |
| 5,625,803 A | 4/1997 | McNelly et al. |
| 5,768,145 A | 6/1998 | Roethig |

FOREIGN PATENT DOCUMENTS

EP 0 544 224 A2 6/1993

OTHER PUBLICATIONS

Patent Database Search Results 1976-1999, dated Jan. 21, 1999.

*Primary Examiner*—Hosuk Song
(74) *Attorney, Agent, or Firm*—Laurence A. Greenberg; Werner H. Stemer; Ralph E. Locher

(57) ABSTRACT

Differential power analysis on an integrated circuit is made more difficult by providing a circuit configuration for generating current pulses in the supply current of the integrated circuit. These additional pulses that are generated in the supply current are synchronous with the edges of the internal clock signal of the integrated circuit. In this case, the pulse shape and also the amplitude and the time profile are similar to the pulses in the supply current which are generated by other circuit sections, for example by processors or by some other digital logic, and in digital circuits, typically correspond to a charging curve of a capacitor via a resistor. The circuit generates these additional pulses by using a delay element.

26 Claims, 3 Drawing Sheets

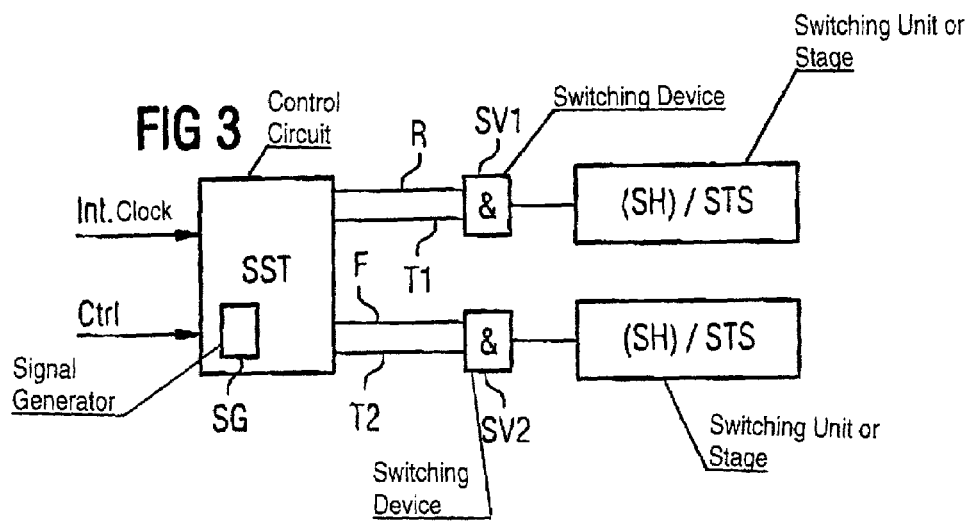
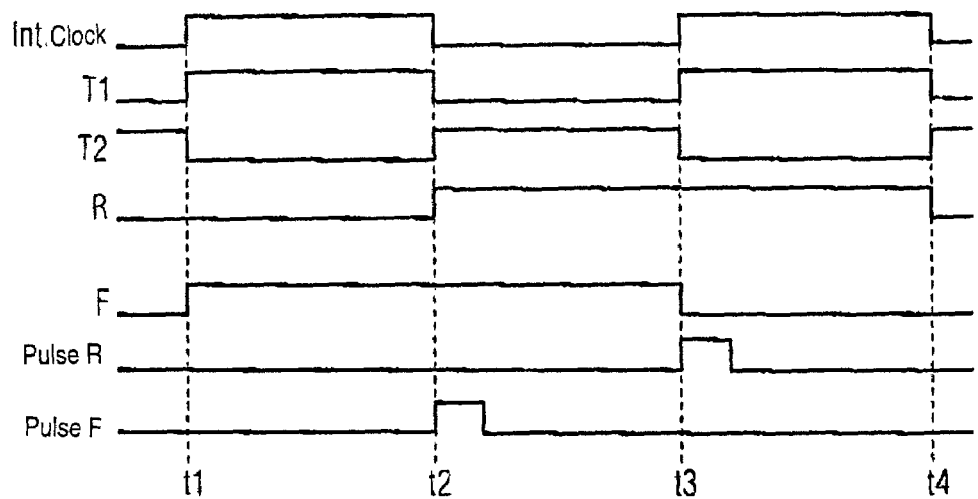
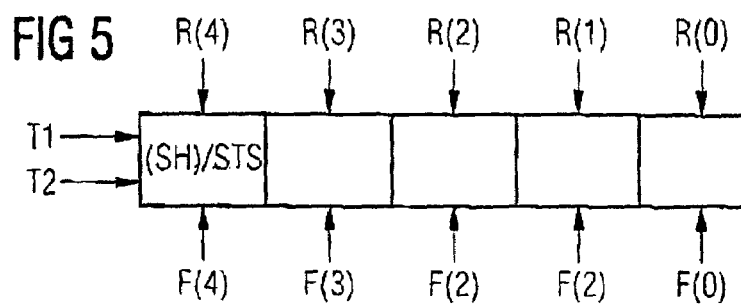

US 7,017,048 B2

CIRCUIT CONFIGURATION FOR GENERATING CURRENT PULSES IN THE SUPPLY CURRENT OF INTEGRATED CIRCUITS

CROSS-REFERENCE TO RELATED APPLICATION

This application is a continuation of copending International Application No. PCT/EP00/03879, filed Apr. 28, 2000, which designated the United States.

BACKGROUND OF THE INVENTION

FIELD OF THE INVENTION

There are many incentives to manipulate and/or analyze integrated circuits, in particular those for use in portable data carriers such as smart cards, since they are increasingly being used in security-critical areas such as access control, as reloadable cash cards or for generating electronic signatures.

The critical elements for the security of the aforementioned applications are usually specially configured circuit sections or secret information stored in nonvolatile memories. In order to prevent covert observation of these details, a previous proposal was to realize circuit sections in deeper planes of the integrated circuit, so that they are concealed by overlying structures. Other proposals were geared toward providing an additional, preferably conductive, covering that covers the integrated circuit and that is incorporated into the power supply. The presence or intactness of this covering can be detected in order to correspondingly influence the processing sequence in the integrated circuit. Furthermore, encryption of the data exchange between component parts of a circuit on a single semiconductor chip has also already been proposed.

However, all of these protective measures do not adequately combat analysis methods—known for some time—which are restricted to observing and statistically evaluating the externally measurable supply current profile during use as intended, that is to say without altering the semiconductor chip. These methods have become known as single power analysis and differential power analysis and a brief description of these methods is published for example on the Internet page http://www.cryptography.com.

Accordingly, it has been shown that during the same sequences within the integrated circuit—for example when executing the same instruction in a microprocessor—the same current profile can be measured at the supply voltage input terminal. By statistically evaluating this current profile, it is even possible to determine individual bits of a secret number required for encryption.

SUMMARY OF THE INVENTION

It is accordingly an object of the invention to provide a circuit configuration for protecting an integrated circuit against analysis and manipulation, which overcomes the above-mentioned disadvantages of the prior art apparatus of this general type.

With the foregoing and other objects in view there is provided, in accordance with the invention, a circuit configuration for generating current pulses in the supply current of an integrated circuit. The circuit configuration includes connections for receiving supply potentials, and at least one switching unit including two complementary controllable switching elements connected in series between the connections for receiving the supply potentials. The two complementary controllable switching elements include a pull-up switching element having a control terminal and a pull-down switching element having a control terminal. The switching unit has an input terminal that is driven by a first control signal having a rising edge and a falling edge. The input terminal is connected to the control terminal of the pull-up switching element and to the control terminal of the pull-down switching element. The circuit configuration also includes a delay element that is configured between the input terminal and either the control terminal of the pull-up switching element or the control terminal of the pull-down switching element, so that a current pulse is generated either at the rising edge of the first control signal or the falling edge of the first control signal.

In accordance with an advantage of the invention, differential power analysis on integrated circuits, in particular on digital integrated CMOS circuits, is made more difficult by generating additional pulses in the supply current, which are, in particular, synchronous with the edges of the internal clock signal of the integrated circuit. In this case, the pulse shape and also the amplitude and the time profile are similar to the pulses in the supply current which are generated by other circuit sections, for example, by processors or by some other digital logic. In digital circuits, the pulse shape, amplitude, and time profile typically correspond to a charging curve of a capacitor via a resistor.

Despite the relatively high pulse amplitudes desired, the circuit configuration utilizes only relatively small capacitors, so that a large area on the chip is not required. Furthermore, the amplitude and the charging time constant and also the duration of the current pulses can be set largely independently of one another.

The circuit configuration can be used in any desired integrated circuit that is constructed with complementary switching elements which are connected in series between the supply voltage terminals and whose control inputs are connected to one another, so that one of the two switching elements is always activated. Although the essential features of the invention are explained below with reference to CMOS circuits, this is not intended to signify a restriction to this technology. Moreover, the current spikes can be caused by the switching edges of arbitrary control signals at the input terminal of a switching unit or of a switching stage. In this case, too, the clock signal used below as an example is not intended to signify a restriction to a specific control signal.

In accordance with an added feature of the invention, a delay element is provided at the gate of one of the two transistors of a CMOS inverter stage. As a result, in the event of a signal change at the input of the CMOS inverter stage, one transistor is immediately switched on and the other transistor is switched off in a delayed manner. Between these two switching points, a parallel-path current flows through the CMOS inverter. The amplitude of the current is essentially determined by the dimensioning of the transistors and the time constant is essentially determined by the delay element at the gate of the transistor that is switched on.

In accordance with an additional feature of the invention, the circuit configuration can be formed merely with one switching unit in which a delay element is arranged at the gate of one of the switching elements. It is also possible, however, to form a circuit configuration with two series-connected switching units which constitute a preliminary stage and a final stage, and in which a delay element is arranged only at the control terminal of one of the switching elements of the final stage.

In accordance with another feature of the invention, switching units or switching stages can in each case be activated or deactivated by switching devices connected upstream. The switching devices can be activated or deactivated by a control signal, in particular, a clock signal. Furthermore, by inverting the control or clock signal or interchanging the respective control terminal of a switching element that is driven in a delayed manner, it is possible to establish whether the current pulse is in each case generated in the event of the positive or negative edge of the control signal.

In accordance with a further feature of the invention, it is also possible to use a plurality of switching units or switching stages, in particular with different amplitudes in each case. Similar to the D/A converter principle, a specific amplitude can thereby be obtained in a manner dependent on the number of activated switching units or switching stages.

In accordance with a further added feature of the invention, the switching units or switching stages are selected by control signals that drive the switching devices of a control circuit.

In accordance with a further additional feature of the invention, the control circuit has a signal generator designed as a random number generator, so that the amplitude of the generated current pulses and the instant of their generation varies randomly in the event of a rising or falling control signal edge, in particular a clock signal edge.

In accordance with a concomitant feature of the invention, the signal generator can also generate deterministic signals. The selection of the signal generator depends on the desired purpose.

Other features which are considered as characteristic for the invention are set forth in the appended claims.

Although the invention is illustrated and described herein as embodied in a circuit configuration for generating current pulses in the supply current of integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows a third embodiment of the circuit configuration with a control circuit for selecting the switching edge of the control signal;

FIG. 4 shows a signal diagram corresponding to the circuit shown in FIG. 3;

FIG. 5 shows a multi-stage circuit configuration for generating different pulse amplitudes;

DESCRIPTION OF THE PREFERRED EMBODIMENTS

Figure 1:
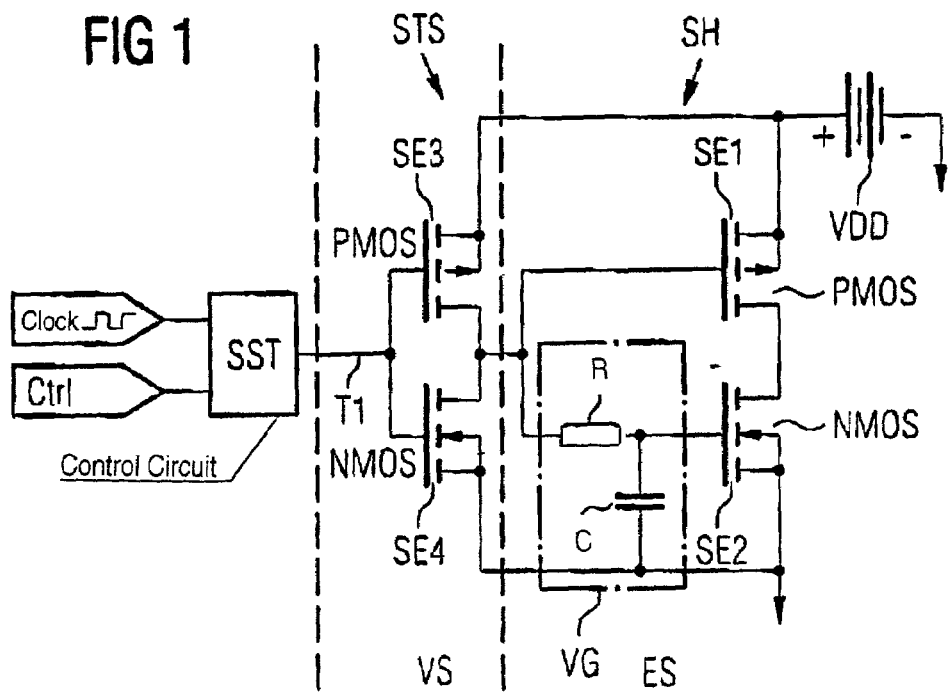
FIG. 1 shows a first embodiment of a circuit configuration with a switching stage formed from a preliminary stage and a final stage.

Referring now to the figures of the drawing in detail and first, particularly, to FIG. 1 thereof, there is shown a first switching element SE1, formed by a PMOS transistor, and a second switching element SE2, formed by an NMOS transistor. The first switching element SE1 and second switching element SE2 are connected in series between a supply voltage VDD of an integrated circuit and the ground terminal. The control or gate terminals of the switching elements SE1, SE2 (or MOS transistors) are connected to one another and form an input terminal of a circuit unit SH formed by the switching elements SE1, SE2. A delay element VG is arranged between this input terminal and the gate terminal of the NMOS transistor. This delay element VG is formed by an RC element in the example illustrated. The value of the resistor R in this example is 20 kΩ and the value of the capacitor C is 700 fF.

The switching unit SH described above forms the final stage ES of a switching stage STS in the example shown in FIG. 1. Connected upstream of this final stage ES is a preliminary stage VS, which is likewise designed as a switching unit with two complementary switching elements SE3, SE4 connected as a CMOS inverter in the example illustrated. A first control signal T1, which may, in particular, be a clock signal, is fed to this switching stage STS by a control circuit SST. The control circuit SST has a clock signal and an activation signal Ctrl applied to it.

In the switching stage STS, in the event of a rising edge of the first control signal T1, a falling edge is switched via the preliminary stage CMOS inverter VS to the input terminal of the final stage CMOS inverter ES, as a result of which falling edge the PMOS transistor SE1 is turned on, while the NMOS transistor SE2 is turned off only in a delayed manner by means of the delay element VG. As a result, a current pulse flows from the supply voltage VDD via the transistors to ground, whose amplitude is determined by the width/length ratios of the transistor channels and whose duration is determined by the delay time of the delay element VG. The pulse duration can be set through the degree of asymmetry of the width/length ratios of the transistor channels. The individual pulse parameters are set largely independently of one another in the circuit configuration.

Figure 2:
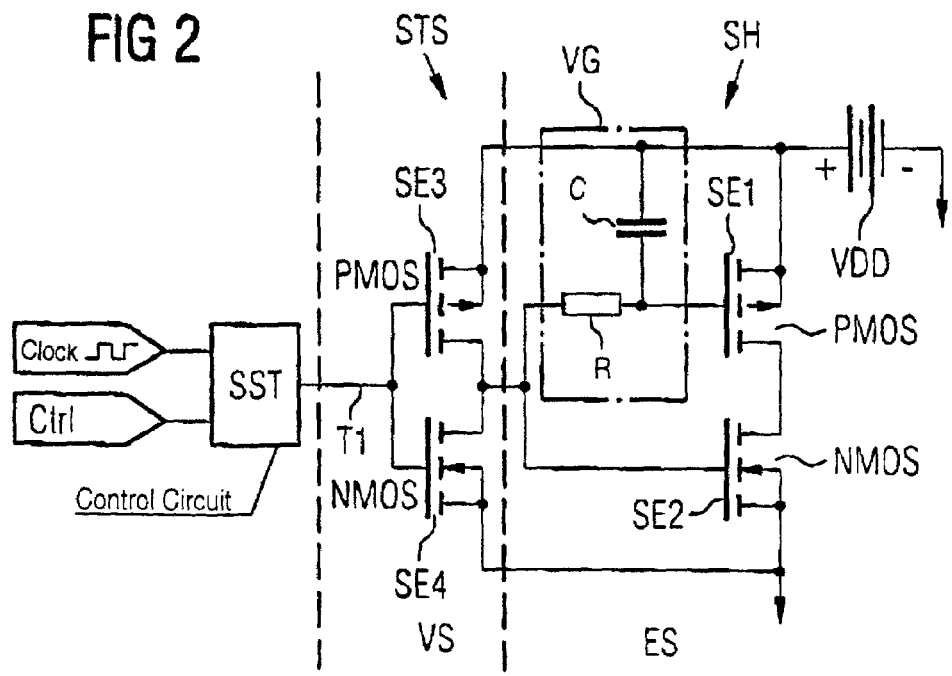
FIG. 2 shows a second embodiment of the circuit configuration.

FIG. 2 illustrates a further embodiment of the circuit configuration, which differs from the circuit configuration shown in FIG. 1 only in that the delay element VG is not arranged between the input terminal of the final stage switching unit ES and the gate terminal of the NMOS transistor switching element SE2, but rather between the input terminal of the final stage switching unit ES and the gate terminal of the PMOS transistor switching element SE1. This has the effect that the current pulse is generated in the event of a falling edge of the first control signal T1 at the input of a switching stage STS constructed from a preliminary stage VS and a final stage ES.

In the embodiments illustrated in FIGS. 1 and 2, the delay element VG is formed with an RC element. In FIG. 1 the capacitor C is connected to ground and in FIG. 2 the capacitor C is connected to the supply voltage VDD. It would likewise be possible to connect the capacitor C to the supply voltage VDD in FIG. 1 and to ground in FIG. 2. Instead of being formed with an RC element, the delay element VG can also be formed with logic gates having suitable delay times, or with a combination of gates with capacitors.

Since the current pulses generated by the circuit configuration are intended to be used to mask the actual current profile of an integrated circuit in order to make it more difficult to perform an evaluation using the differential power analysis method, it is desirable for the current pulses to be generated in a randomly fluctuating manner sometimes in the event of the rising edge and sometimes in the event of the falling edge of the first control signal T1. One example of a circuit configuration with which a current pulse can be generated in the event of the rising edge and/or in the event of the falling edge of a control signal is specified in FIG. 3.

FIG. 3 specifies that such a circuit configuration can be formed both with a switching unit SH and with a switching stage STS. This applies only in principle, however, since a switching stage STS, on account of the additional inverter, generates a pulse at a different edge of the control signal than that generated by a switching unit SH. The following details concerning FIG. 3 relate to a switching stage STS.

In accordance with the embodiment therein, two identical switching stages STS are provided, which can each be driven via a respective switching device SV1 and SV2 that each are formed by an AND gate in the example illustrated. The switching devices SV1 and SV2 respectively receive a first control signal T1 and a second control signal T2 that is complementary to the first control signal T1. The selection is effected by a first selection signal F, by means of which a current pulse will be generated in the event of a rising edge of the first control signal T1. The selection is alternatively effected by a second selection signal F, by means of which a current pulse will be generated in the event of a falling edge of the first control signal T1 or in the event of a rising edge of the second control signal T2 complementary thereto.

All the control signals T1, T2, R, F are generated by a control circuit SST that is driven by an internal clock signal Int.Clock and also by an activation signal Ctrl. In FIG. 3, the switching stages STS are designed in accordance that shown in FIG. 1. The function of the circuit shown in FIG. 3 will now be explained with reference to the signal diagram shown in FIG. 4.

In an integrated circuit realized on a semiconductor chip, a clock signal enables the synchronization of individual sequences. Switching operations usually take place in the event of rising or falling edges of this clock signal. Such an internal clock signal INT.CLOCK is illustrated in FIG. 4 as a reference signal which is also fed to the control circuit SST in FIG. 3. From this internal clock signal INT.CLOCK, the control circuit SST derives the first control signal T1, the second control signal T2 complementary thereto, and also the selection signals R, F.

In the preferred exemplary embodiment illustrated, two complementary control signals T1, T2 were chosen so that only one type of switching stage has to be realized. In principle, a control signal whose rising and falling edges can be evaluated would also suffice. In this case, however, two types of switching stages in accordance with that shown in FIGS. 1 and 2 would be necessary.

In FIG. 4, the first control signal T1 corresponds approximately to the reference signal INT.CLOCK, since it is expedient to generate current pulses at the same point in time at which the circuit-dictated current pulses of the current profile of the integrated circuit are also generated.

The first selection signal R must activate the first switching device SV1 in a time range in which a rising edge of the first control signal T1 occurs. Since the rising edge of the second control signal T2 occurs in a manner shifted by half a period duration with respect to the rising edge of the first control signal T1, the second selection signal F must likewise be shifted, which is illustrated in FIG. 4.

As can be further discerned from FIG. 4, whenever the first selection signal R activates the first switching device SV1, that is to say has a high level in the illustrated example of an AND gate, a current pulse (Pulse R) is generated in the event of a rising edge of the first control signal T1. In a corresponding manner, a current pulse (Pulse F) is generated when the second selection signal F activates the second switching device SV2 and a rising edge occurs in the second control signal T2.

If the intention is to generate current pulses having amplitudes of different levels, a plurality of circuit configurations in accordance with that shown in FIG. 3 can be connected in parallel with regard to the control signals T1, T2. This is illustrated in FIG. 5 using the example of five switching stages STS. In this case, five selection signals R(0) ... R(4) for current pulses in the event of rising edges and five selection signals F(0) ... F(4) for current pulses in the event of falling edges are provided.

The switching stages STS can advantageously be dimensioned in such a way that the pulse amplitudes of a switching stage STS are twice as high as those of an adjacent switching stage STS, that is to say have, for example, the normalized values 1, 2, 4, 8 and 16.

Figure 6:
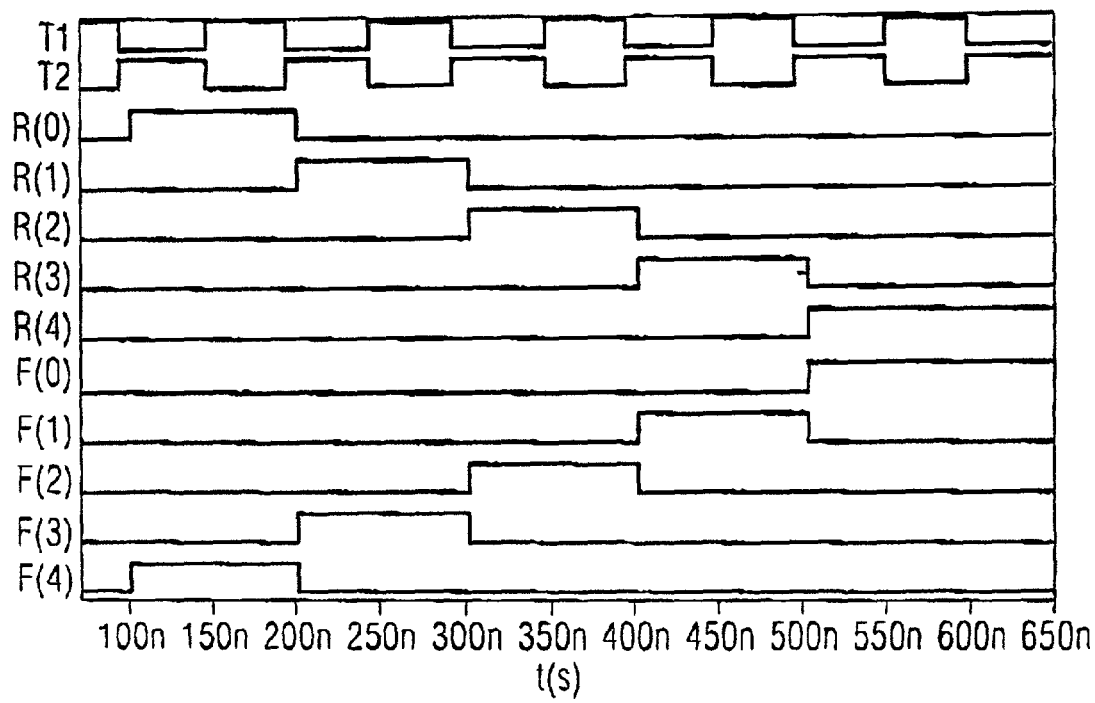
FIG. 6 shows a diagram of exemplary signals that can be applied to the inputs of the circuit shown in FIG. 5.
Figure 7:
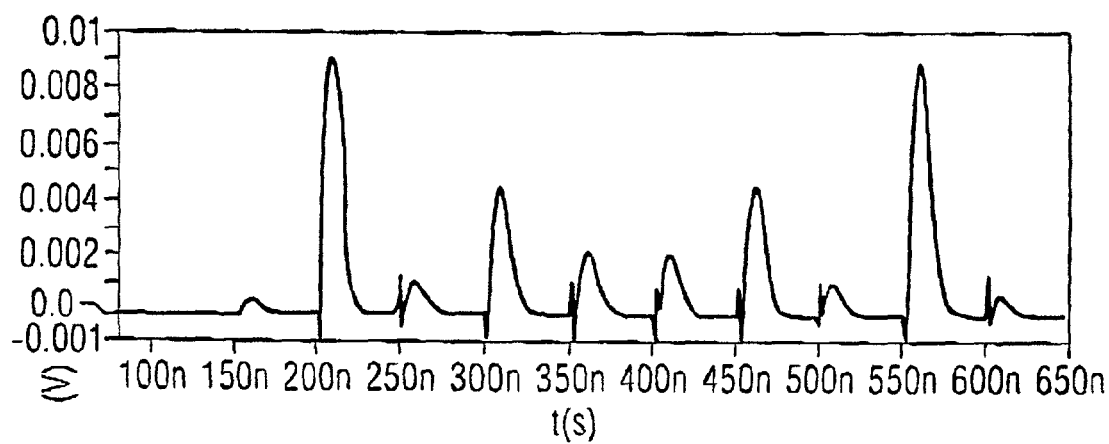
FIG. 7 shows the current pulse train that can be generated with the circuit configuration shown in FIG. 5 when the selection signals shown in FIG. 6 are applied to the circuit configuration.

FIG. 7 illustrates what current pulse train can be generated with a circuit configuration in accordance with FIG. 5 when selection signals in accordance with FIG. 6 are applied to the circuit configuration.

In the circuit configuration in accordance with FIG. 5, a group of five switching stages STS are connected in parallel with regard to the first control signal T1 and a further group of five switching stages STS are connected in parallel with regard to the second control signal T2.

In this case, the switching stages STS of the group, depending on the state of the selection signals R(0) ... R(4), generate current pulses in the event of rising edges of the first control signal T1, while the switching stages STS of the further group, depending on the state of the selection signals F(0) ... F(4), generate current pulses in the event of falling edges of the first control signal T1, in the event of rising edges of the second control signal T2 that is complementary to the first control signal T1. In this case, the switching stages STS are constructed identically, in principle, so that they generate current pulses in the event of rising edges. As can be gathered from the illustration in FIG. 6, it may be necessary for the second selection signals F(0) ... F(4) to be delayed somewhat by a latch circuit, for example, in order to ensure that the rising edge of the second control signal T2 occurs during the presence of the second selection signals F(0) ... F(4).

However, it would also be possible to form a first group of switching stages STS which generate a current pulse in the event of rising edges of the first control signal T1, and to form a second group of switching stages SST which generate a current pulse in the event of a falling edge of the first control signal T1, which are all connected in parallel with regard to the first control signal T1. However, different types of switching stages STS would have to be used in this case, as has already been explained with regard to FIG. 3.

Thus, with the circuit configuration as elucidated in the figures in the event of arbitrary edges of a clock signal, under the control of a signal generator SG, current pulses of varying magnitude can be generated in the supply current of an integrated circuit and a noise can thus be superposed on the current profile of the integrated circuit, with the result that single or differential power analysis is made significantly more difficult, if not entirely prevented.

We claim:

1. A circuit configuration for generating current pulses in the supply current of an integrated circuit, comprising:
   connections for receiving supply potentials;
   at least one switching unit including two complementary controllable switching elements connected in series between said connections for receiving the supply potentials, said two complementary controllable switching elements including a pull-up switching element having a control terminal and a pull-down switching element having a control terminal, said switching unit having an input terminal that is driven by a first control signal having a rising edge and a falling edge, said input terminal connected to said control terminal of said pull-up switching element and said control terminal of said pull-down switching element;
   a delay element configured between said input terminal and a control terminal, selected from the group consisting of said control terminal of said pull-up switching element and said control terminal of said pull-down switching element, so that a current pulse is generated in an event selected from the group consisting of the rising edge of the first control signal and the falling edge of the first control signal.

2. The circuit configuration according to claim 1, comprising:
   a further switching unit connected upstream of said switching unit;
   said further switching unit including two complementary switching elements having control terminals;
   said two complementary switching elements forming a junction point therebetween;
   said further switching unit having an input terminal directly connected to said control terminals of said complementary switching elements of said further switching unit;
   said further switching unit having an output terminal formed by said junction point between said two complementary switching elements;
   said switching unit and said further switching unit forming a switching stage having an input terminal defined by said input terminal of said further switching unit; and
   said input terminal of said switching stage being driven with the first control signal.

3. The circuit configuration according to claim 2, wherein said further switching unit forms a CMOS inverter circuit.

4. The circuit configuration according to claim 1, wherein said switching unit includes a CMOS inverter circuit.

5. The circuit configuration according to claim 1, comprising:
   a plurality of switching units connected in parallel with regard to the first control signal;
   a control circuit; and
   a plurality of switching devices being driven by said control circuit;
   each one of said plurality of said switching devices being for feeding the first control signal to a respective one of said plurality of said switching units.

6. The circuit configuration according to claim 5, wherein said plurality of said switching units are dimensioned to generate current pulses of different magnitudes.

7. The circuit configuration according to claim 6, wherein said plurality of said switching units are formed such that current pulses are generated at the rising edge of the first control signal.

8. The circuit configuration according to claim 6, wherein said plurality of said switching units are formed such that current pulses are generated at the falling edge of the first control signal.

9. The circutit configuration according to claim 6, wherein:
   said plurality of said switching units includes a first group of switching units and a second group of switching units;
   said first group of said switching units are formed such that current pulses are generated at the rising edge of the first control signal; and
   said second group of said switching units are formed such that current pulses are generated at the falling edge of the first control signal.

10. The circuit configuration according to claim 5, wherein said plurality of said switching units are formed such that current pulses are generated at the rising edge of the first control signal.

11. The circuit configuration according to claim 5, wherein said plurality of said switching units are formed such that current pulses are generated at the falling edge of the first control signal.

12. The circuit configuration according to claim 5, wherein:
   said plurality of said switching units includes a first group of switching units and a second group of switching units;
   said first group of said switching units are formed such that current pulses are generated at the rising edge of the first control signal; and
   said second group of said switching units are formed such that current pulses are generated at the falling edge of the first control signal.

13. The circuit configuration according to claim 5, wherein said control circuit has a signal generator for generating bit patterns for driving said plurality of said switching devices.

14. The circuit configuration according to claim 13, wherein said signal generator is a random number generator.

15. The circuti configuration according to claim 1, comprising:
   a plurality of switching units including a first group of switching units and a second group of switching units;
   a first switching device for feeding the first control signal to said first group of said switching units;
   a second switching device for feeding a second control signal, which is complementary to the first control signal, to said second group of said switching units; and
   a control circuit driving said first switching device and said second switching device;
   said first group of said switching units being connected in parallel with regard to the first control signal;
   said second group of said switching units being connected in parallel with regard to the second control signal;
   said first group of said switching units being formed such that current pulses are generated at the rising edge of the first control signal; and said second group of said switching units being formed such that current pulses are generated at the rising edge of the second control signal.

16. The circuit configuration according to claim 1, comprising:
   a plurality of switching stages connected in parallel with regard to the first control signal;
   a control circuit; and
   a plurality of switching devices being driven by said control circuit;
   each one of said plurality of said switching devices being for feeding the first control signal to a respective one of said plurality of said switching stages.

17. The circuit configuration according to claim 16, wherein said plurality of said switching stages are dimensioned to generate current pulses of different magnitudes.

18. The circuit configuration according to claim 17, wherein said plurality of said switching stages are formed such that current pulses are generated at the rising edge of the first control signal.

19. The circuit configuration according to claim 17, wherein said plurality of said switching stages are formed such that current pulses are generated at the falling edge of the first control signal.

20. The circuit configuration according to claim 17, wherein:
   said plurality of said switching stages includes a first group of switching stages and a second group of switching stages;
   said first group of said switching stages are formed such that current pulses are generated at the rising edge ofo the first control signal; and
   said second group of said switching units are formed such that current pulses are generated at the falling edge of the first control signal.

21. The circuit configuration according to claim 16, wherein said plurality of said switching stages are formed such that current pulses are generated at the rising edge of the first control signal.

22. The circuit configuration according to claim 16, wherein said plurality of said switching stages are formed such that current pulses are generated at the falling edge of the first control signal.

23. The circuit configuration according to claim 16, wherein:
   said plurality of said switching stages includes a first group of switching stages and a second group of switching stages;
   said first group of said switching units are formed such that current pulses are generated at the rising edge of the first control signal; and
   said second group of said switching stages are formed such that current pulses are generated at the falling edge of the first control signal.

24. The circuit configuration according to claim 16, wherein said control circuit has a signal generator for generating bit patterns for driving said plurality of said switching devices.

25. The circuit configuration according to claim 24, wherein said signal generator is a random number generator.

26. The circuit configuration according to claim 1, comprising:
   a plurality of switching stages including a first group of switching stages and a second group of switching stages;
   a first switching device for feeding the first control signal to said first group of said switching stages;
   a second switching device for feeding a second control signal, which is complementary to the first control signal, to said second group of said switching units; and
   a control circuit driving said first switching device and said second switching device;
   said first group of said switching stages being connected in parallel with regard to the first control signal;
   said second group of said switching stages being connected in parallel with regard to the second control signal
   said first group of said switching stages being formed such that current pulses are generated at the rising edge of the first control signal; and
   said second group of said switching stages being formed such that current pulses are generated at the rising edge of the second control signal.

* * * * *